United States Patent [19]

Wu

[11] Patent Number: 4,614,864

[45] Date of Patent: Sep. 30, 1986

[54] APPARATUS FOR DETECTING DEFOCUS

[75] Inventor: Frederick Y. Wu, Cos Cob, Conn.

[73] Assignee: The Perkin-Elmer Corporation, Norwalk, Conn.

[21] Appl. No.: 614,360

[22] Filed: May 29, 1984

[51] Int. Cl.⁴ .............................................. G01J 1/20
[52] U.S. Cl. ................................ 250/201; 250/237 G
[58] Field of Search ............ 250/201 AF, 201 R, 561, 250/237 R, 237 G; 354/402, 403, 406, 409; 356/4, 4.5, 5, 123, 125, 373, 375, 371

[56] References Cited

U.S. PATENT DOCUMENTS

| | | | |
|---|---|---|---|
| 3,663,107 | 5/1972 | Denis et al. | 356/371 |
| 3,758,209 | 9/1973 | Harvey | 354/403 |
| 4,011,446 | 3/1977 | Swanberg | 250/201 AF |
| 4,336,997 | 6/1982 | Röss et al. | 356/4 |

Primary Examiner—Edward P. Westin
Attorney, Agent, or Firm—Thomas P. Murphy; Edwin T. Grimes; Richard C. Wilder

[57] ABSTRACT

The present invention is directed to apparatus for detecting defocus which is particularly adapted, among other possible uses, for use with microlithography projection systems; said apparatus being characterized by a reticle, a source of illumination for illuminating said reticle, a beam splitter, a projection lens system, a wafer mounted in a primary image plane of the projection lens system, said beam splitter and projection lens system being arranged to project an image of the reticle on the wafer, a mask complementary to the reticle mounted in a secondary image plane, said beam splitter and said projection lens system being arranged to reimage light reflected from the wafer onto the complementary mask, and detector means mounted to collect light transmitted by the complementary mask. In one form of the invention the apparatus further includes a system for modulating the wafer and a phase-sensitive demodulation circuit for demodulating the output of the detector to obtain a bipolar electrical focus error signal.

3 Claims, 8 Drawing Figures

APPARATUS FOR DETECTING DEFOCUS

FIELD OF INVENTION

This invention relates to the field of microlithography and, more particularly, to apparatus for detecting defocus. The apparatus is particularly adapted, among other possible uses, for use with microlithography projection systems.

BACKGROUND OF THE INVENTION

Reciprocal imaging systems are known such as, for example, the system described in the publication entitled "Reciprocal Optical System for Measuring the State of Focus of Reflected Images", Journal of the Optical Society of America, Vol. 58, No. 12, p. 1607, December 1968, by H. D. Crane and G. L. Pressman.

This prior art system involved imaging an illuminated pattern onto a reflecting surface and reimaging the reflection back through the same optical system onto the original pattern. If the first image is in focus on the reflecting surface, then by optical reciprocity, the returned image is congruent with and superimposed upon the original source pattern. As the reflecting surface moves out of the image plane, some of the returned light falls beyond the input pattern. Thus, intercepted light is nominally zero when the mirror is in the image plane, and increases with displacement in either direction away from focus. In practice there are serious problems arising from the need to separate the intercepted light from the projected light (that which will form the wafer image) and other sources of stray light.

SUMMARY OF THE INVENTION

Briefly, the present invention is directed to new and improved apparatus for detecting defocus which is characterized by means for mounting a reticle, means for illuminating the reticle, a beam splitter, and projection lens means. In addition, the detecting defocus apparatus includes means for mounting a photosensitive surface such as a wafer at a primary image plane of the projection lens means, said beam splitter and said projection lens means being arranged to project an image of the reticle on the wafer, and a mask complementary to said reticle being mounted in a secondary image plane. Further, the beam splitter and the projection lens means are arranged to reimage light reflected from the wafer on the complementary mask and detector means are provided to collect light transmitted by the complementary mask. In addition, according to the invention, means are provided for modulating the wafer, and phase-sensitive demodulation means are provided for demodulating the output of the detector means to obtain a bipolar electrical focus error signal.

There has thus been outlined rather broadly the more important features of the invention in order that the detailed description thereof that follows may be better understood, and in order that the present contribution to the art may be better appreciated. There are, of course, additional features of the invention that will be described hereinafter which will form the subject of the claims appended thereto. Those skilled in the art will appreciate that the conception upon which the disclosure is based may readily be utilized as a basis for the designing of other systems for carrying out the several purposes of the invention. It is important, therefore, that the claims be regarded as including such equivalent systems as do not depart from the spirit and scope of the invention. A specific embodiment of the invention has been chosen for purposes of illustration and description, and is shown in the accompanying drawings, forming a part of the specification.

DETAILED DESCRIPTION OF A PRESENTLY PREFERRED EMBODIMENT

Figure 1:
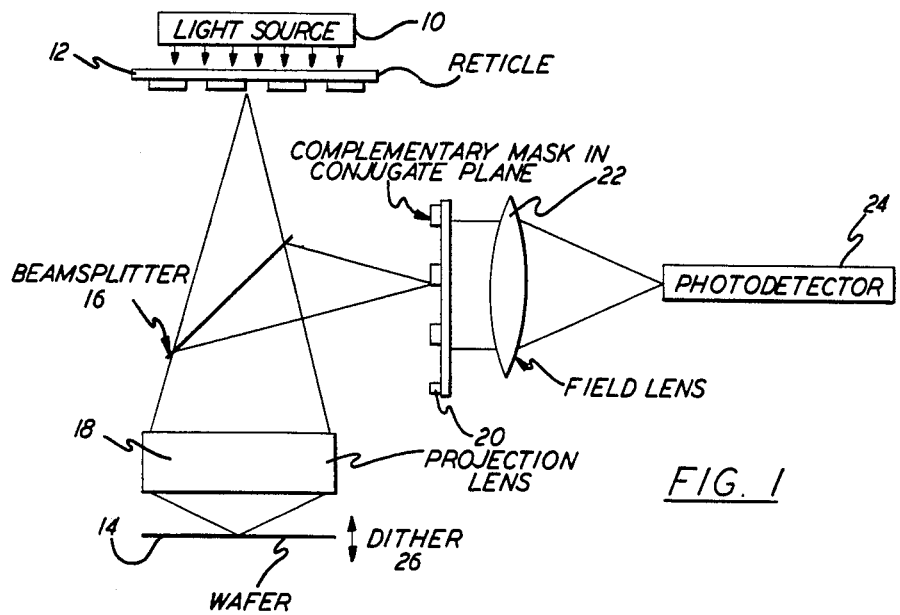
FIG. 1 is a schematic diagram showing apparatus for detecting defocus, according to the present invention.

Apparatus for detecting defocus according to the invention is shown in FIG. 1, wherein light from a light source 10 illuminates a high contrast object or reticle 12 mounted on a reticle mount. The reticle is to be imaged onto a wafer 14 or other photosensitive surface mounted on a wafer platform in the primary image plane. The image is projected via a beam splitter 16 and projection lens 18. The specular component of light reflective from the wafer 14 forms a "reflected image" via the beam splitter 16. This reflected light is reimaged in a secondary image plane in which is located a "complementary mask" 20, which is essentially a negative of the reticle 12. That is, the transparent parts of the reticle 12 are opaque on the mask 20 and vice versa and, as a result, the mask serves to block most of the light in the reflected image. Behind the mask 20 is a field lens 22 and a detector 24, which collects whatever light that gets through the mask.

The amount of light that reaches the detector depends on a number parameters including defocus of the image in the plane of the mask, lateral misalignment of the mask with respect to the image and diffraction at the edges of the reticle.

Figure 2A:
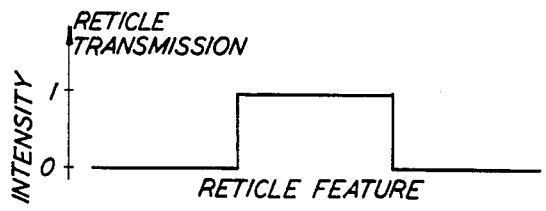
FIGS. 2a–2d are graphic representations of the waveforms of the optical signals showing the occurrence of defocus.
Figure 2B:
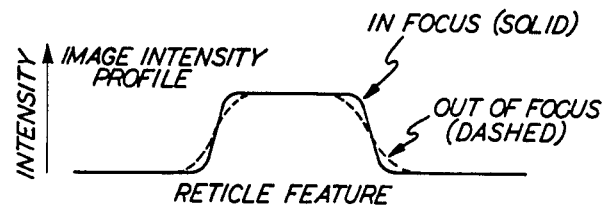
Figure 2C:
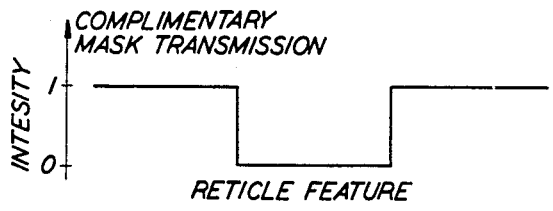
Figure 2D:
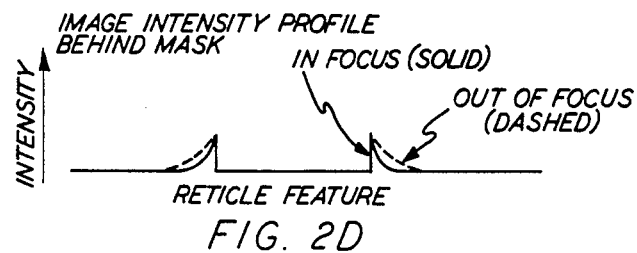
Figure 3:
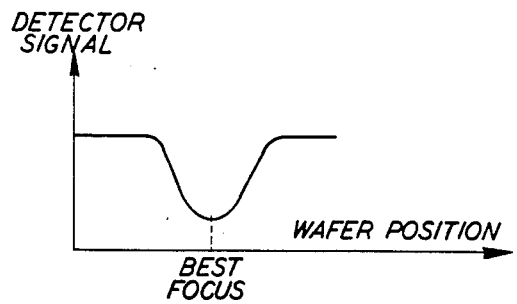
FIG. 3 is a graphic representation showing wafer position versus detector output.
Figure 5:
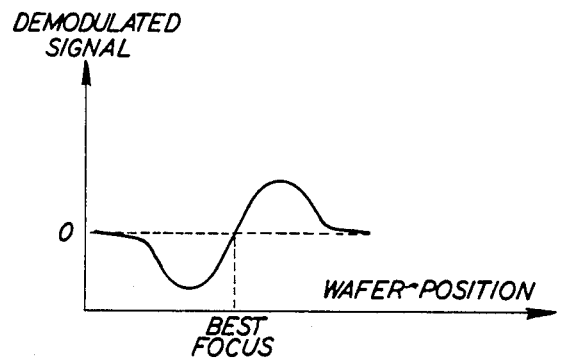
FIG. 5 is a graphic representation showing the lock-in amplifier output versus wafer position.

For example, FIG. 2a shows a possible feature on a reticle. The resulting image formed in the secondary image plane, after traversal of the lens, reflection off the wafer and a second traversal of the lens, is shown in FIG. 2b. The image shown by the solid lines is in focus and the image shown by the broken lines is out of focus. It is particularly noted that the sharpness of the edges decreases as the image is defocused. Assuming that the reticle and mask are in proper positions relative to the lens and each other, any defocus is due to error in the position of the wafer. FIG. 2c shows a complementary mask transmission, which blocks most of the light in a well-focused image. FIG. 2d shows the image intensity profile behind the mask. The amount of light transmitted increases with defocus in either direction. This is clearly shown in FIG. 3, which plots the detector signal against the wafer position. Best focus is characterized by minimum light transmission and, hence, minimum detector output. Thus, minimizing the detected light by changing the wafer position puts the reflected image in best focus at the complementary mask plane. In order to find the position of minimum mask transmission, the wafer is dithered as indicated at 26, FIG. 1, and the resulting modulated detector signal is synchronously demodulated. This yields an output signal similar to the derivative of the detector signal versus wafer position curve, as shown in FIG. 5. The output signal can be used to servo the wafer stage for automatic focusing.

Figure 4:
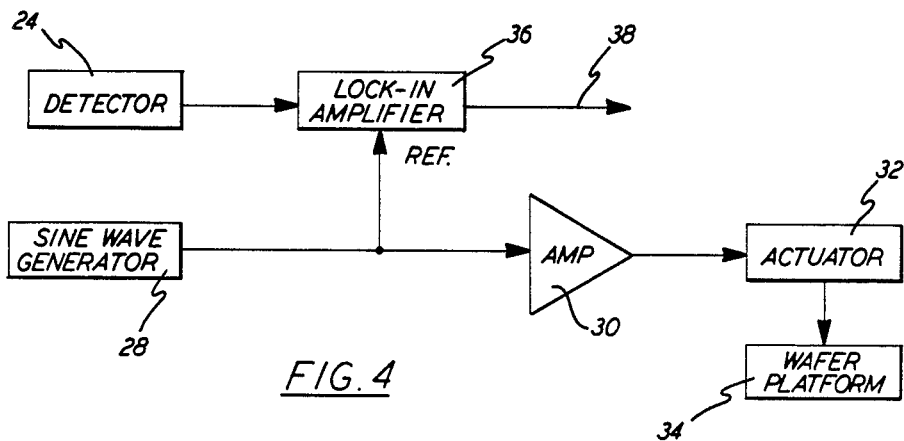
FIG. 4 is a schematic diagram of an electrical circuit for processing the detector output signals.

FIG. 4 is a schematic diagram of an electrical circuit for processing the detector output signals in the manner as described above. That is, an electrical error signal is obtained by dithering or modulating the position of the wafer in a direction parallel to the optical axis of the projection lens. A sine wave generated by a sine wave generator 28, FIG. 4, is amplified by amplifier 30 and drives an actuator 32 connected to the wafer platform 34, causing the wafer to vibrate with respect to the lens, parallel to the optical axis. Consequently, the amount of light striking the detector 24 is modulated. The detector output is synchronously demodulated with respect to the sine wave modulation by a lock-in amplifier (phase-sensitive detector) 36. The output 38 of the lock-in amplifier is a bipolar electrical signal which over a limited range of defocus is proportional to defocus and has opposite polarity on opposite sides of the best focus, as seen in FIG. 5. Such a signal can be used to correct focus or obtain a desired defocus either manually or automatically. Manual correction involves moving the wafer to a position where the lock-in output is zero. Automatic focusing necessitates feeding the output to an actuator controlling the wafer position.

It will thus be seen that the present invention does indeed provide new and improved apparatus for detecting defocus which uses the imaging properties of the optical system to be focused, which senses defocus with a minimum of data or signal processing, and which senses defocus without mounting extra apparatus in the vicinity of the lens or primary image plane. Although a specific embodiment has been illustrated and described, it will be obvious to those skilled in the art that various modifications may be made without departing from the spirit and scope of the invention which is to be limited solely by the appended claims.

What is claimed is:

1. Apparatus for detecting defocus comprising, in combination:
   means for mounting a reticle;
   means for illuminating said reticle;
   a beam splitter;
   projection lens means;
   means for mounting a wafer at a primary image plane of said projection lens means;
   said beam splitter and said projection lens means being arranged to project an image of said reticle on said wafer;
   a mask complementary to said reticle being mounted in a secondary image plane;
   said beam splitter and said projection lens means being arranged to reimage light reflected from said wafer on said complementary mask; and
   detector means mounted to collect light transmitted by said complementary mask.

2. Apparatus for detecting defocus according to claim 1 further comprising:
   means for modulating said means for mounting said wafer, and phase-sensitive demodulation means for demodulating the output of said detector means to obtain a bipolar electrical focus error signal.

3. Apparatus for detecting defocus according to claim 1 further comprising:
   a sine wave generator;
   actuator means driven by said generator means for effecting a sine wave modulation of said means for mounting said wafer;
   a lock-in amplifier connected to said detector means and to said sine wave generator for synchronously demodulating the output of said detector means with respect to the sine wave modulation; whereby the output of said lock-in amplifier is proportional to defocus.

* * * * *